United States Patent [19]

Beigel et al.

[11] Patent Number: 4,751,401
[45] Date of Patent: Jun. 14, 1988

[54] LOW VOLTAGE SWITCH

[75] Inventors: Michael L. Beigel, Warwick; Lester Brown, Flushing, both of N.Y.; Thomas Miller, Washington, N.J.

[73] Assignee: Core Industries Inc., Bloomfield Hills, Mich.

[21] Appl. No.: 28,959

[22] Filed: Mar. 23, 1987

[51] Int. Cl.[4] ............................................. H01H 9/54
[52] U.S. Cl. ................................... 307/140; 307/115; 307/141.4; 307/632; 179/65 R; 361/389
[58] Field of Search .................... 307/34, 35, 36, 37, 307/38, 39, 40, 41, 112, 115, 125, 140, 141, 149, 150, 151, 252 B; 179/65 R; 361/389

[56] References Cited

U.S. PATENT DOCUMENTS

| | | | |
|---|---|---|---|
| 2,811,603 | 10/1957 | Koch et al. | 200/113 |
| 3,461,354 | 8/1969 | Bollmeier | 317/156 |
| 3,582,714 | 6/1971 | Shmurak et al. | 317/100 |
| 3,641,474 | 2/1972 | Owens | 339/17 L |
| 3,872,371 | 3/1975 | Williams | 307/38 X |
| 3,881,118 | 4/1975 | Forrest et al. | 307/252 B |
| 4,007,378 | 2/1977 | Lazzara | 307/112 |
| 4,023,075 | 5/1977 | Reuter | 361/76 |
| 4,131,379 | 12/1978 | Gordy et al. | 403/197 |
| 4,144,555 | 3/1979 | McGalliard | 361/386 |
| 4,150,440 | 4/1979 | Bonnie et al. | 365/2 |
| 4,158,150 | 6/1979 | Dever | 307/252 B |
| 4,167,031 | 9/1979 | Patel | 361/388 |
| 4,176,288 | 11/1979 | Komatsu et al. | 307/252 B X |
| 4,248,131 | 2/1981 | Larro | 411/15 |
| 4,288,839 | 9/1981 | Prager et al. | 361/386 |
| 4,296,454 | 10/1981 | Wong | 361/380 |
| 4,298,904 | 11/1981 | Koenig | 361/386 |
| 4,321,652 | 3/1982 | Baker et al. | 361/209 |
| 4,322,637 | 3/1982 | Takasago | 307/252 B X |
| 4,324,503 | 4/1982 | Sevence | 403/197 |
| 4,370,564 | 1/1983 | Matsushita | 307/140 |
| 4,385,280 | 5/1983 | Reisem | 335/230 |
| 4,410,927 | 10/1983 | Butt | 361/386 |
| 4,414,521 | 11/1983 | Reisem | 335/281 |
| 4,414,602 | 11/1983 | Mosier | 361/190 |
| 4,443,712 | 4/1984 | Gokita | 307/140 |
| 4,470,002 | 9/1984 | Brown | 320/1 |
| 4,480,195 | 10/1984 | Sawaki et al. | 307/141.4 X |
| 4,525,634 | 6/1985 | Southard | 307/115 |
| 4,535,386 | 8/1985 | Frey, Jr. et al. | 361/389 |
| 4,546,407 | 10/1985 | Benenati | 361/386 |
| 4,547,833 | 10/1985 | Sharp | 361/386 |
| 4,562,512 | 12/1985 | Sutrina | 361/386 |
| 4,577,402 | 3/1986 | Swanstrom | 29/840 |
| 4,587,377 | 5/1986 | Rodseth | 174/16 HS |
| 4,594,643 | 6/1986 | Hermann | 361/386 |
| 4,608,500 | 8/1986 | Togawa | 307/140 X |

Primary Examiner—William M. Shoop, Jr.
Assistant Examiner—Paul Ip
Attorney, Agent, or Firm—Rosen, Dainow & Jacobs

[57] ABSTRACT

A low voltage switch without moving elements, uses a triac power switching element in series with the AC load. A flip-flop circuit provides latching operation for On and Off functions. The triac is isolated from low-voltage actuating circuitry by an optoisolator which draws power from a step down transformer. The transformer also isolates the AC line from the manual switch circuits. A metal case is heat sink for the triac switching element. A threaded nipple, an integral portion of the casing, can be inserted through plug openings in standard electrical junction boxes to form a continuous heat flow path from the triac into the juncture box.

24 Claims, 5 Drawing Sheets

LOW VOLTAGE SWITCH

BACKGROUND OF THE INVENTION

This invention relates generally to an isolated low voltage switch of the type used to replace conventional wiring associated with wall switches receiving line voltage, and more particularly to a solid state switch located substantially at the point of application of line voltage and operated remotely through low voltage connections.

In the prior art, electro-mechanical AC line switches, are remotely operated by means of an isolated low voltage AC control system. The switch contains a step-down transformer to derive a low voltage control signal from conventional line connections. The switching mechanism is operated by connecting the low voltage AC signal across a heating wire mechanically linked to, but electrically isolated from, the line voltage AC switching element. Heating of the control wire causes contraction thereof and by this motion activates the line voltage switch section.

In one application of the prior art, the device is equivalent to a momentary contact switch wherein the line voltage switch is activated only when the heating element is energized and exerting a constant force on the switch element. In another model two heating elements are used and a mechanical latching mechanism turns the latching AC line switch on or off depending upon which heating element is energized. Parallel momentary contact switch actuators at multiple remote locations are frequently used in such applications. These switches have the advantage in providing easy manual switch control from a multiple of remote locations and ability to use inexpensive, thin wire from the manual actuator locations to the actual switch control which throws the line circuit.

However, there are disadvantages in the prior art systems including reliability problems associated with electro-mechanical switching mechanisms and high manufacturing cost due to individual adjustment and test cycling for each unit. U.S. Pat. No. 2,811,603 shows a device of that type.

What is needed, is a solid state low voltage switch which eliminates the reliability problems inherent in electromechanical switching mechanisms and is economical to produce.

SUMMARY OF THE INVENTION

Generally speaking, in accordance with the invention, a low voltage switch without moving elements, relying substantially on solid state circuitry, is provided. The device uses a triac power switching element in series with the AC load in place of a mechanical contact switch such as is used in the prior art. A flip-flop circuit provides latching operation for the On and Off functions. The load carrying triac is isolated from low-voltage actuating circuitry by an optoisolator which electrically separates the triac from the remainder of the switching circuitry which draws power from a step down transformer. Thus, the load and its higher line voltage are isolated from the manual switch circuits. The step-down transformer is also important in isolating the AC line from the manual switch circuits. A metal case acts as heat sink for the substantial quantity of heat generated by the triac switching element when in continuous operation. The low voltage switch of the subject invention can frequently replace existing switch mechanisms on electrical loads, for example, lighting systems which are controlled by wall switches. Reliability of the solid state device is enhanced compared with the prior art electro-mechanical switches, and manufacturing is simplified. Individual calibration of switches is unnecessary and absolutely silent operation is provided.

The switch enclosure is in direct contact with both surfaces of a heat fin provided on commercially available triac elements and provides a heat path for conductive transfer of heat away from the triac. A threaded nipple is an integral portion of the casing. This nipple can be inserted through plug openings in standard electrical junction boxes and when fixed to the junction box with a locking nut, forms a continuous heat flow path from the triac into the junction box to further enhance cooling of the triac.

A spring clip is provided on the nipple for engagement with the junction box where access to the threaded portion of the nipple is not possible from outside the junction box. Thus, the spring clip holds the switch enclosure against the junction box to provide continued heat transfer from the triac into the junction box.

Accordingly, it is an object of this invention to provide an improved low voltage solid state switch which contains no moving parts and is reliable in operation.

Another object of this invention is to provide an improved low voltage solid state switch which is capable of directly replacing and working in conjunction with prior art electromechanical circuit switches.

A further object of this invention is to provide an improved low voltage solid state switch which uses its enclosure as heat sink for heat producing elements within the enclosure.

Still another object of this invention is to provide an improved low voltage solid state switch which is mountable on a conventional electrical junction box or panel with or without use of a holding nut.

Yet another object of this invention is to to prevent generation of unnecessary electrical and RF noise and transients by turning on the AC line only at zero-crossings.

Still other objects and advantages of the invention will in part be obvious and will in part be apparent from the specification.

The invention accordingly, comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

In using a low voltage switch in accordance with invention, an electrical appliance or lighting fixture, which operates on line voltage, is turned On and Off by a remote manual switch. The remote switch is connected to the remaining low voltage circuitry of the invention by means of wires having a low level AC voltage applied thereto. The low voltage switch is located adjacent to the laod device in order to reduce requirements for conventional wiring at line voltage potentials.

With reference to FIGS. 1-8, the low voltage switch 10 is in a thermally conductive enclosure 12 having a body 14 and cover 16. Abutting contact is made between the body 14 and cover 16 along extended and irregularly contoured mating surfaces 18, 20.

Tabs 22, 23 extend from upper and lower surfaces (FIG. 2) of the enclosure body 14, being located substantially flush with adjacent portions of the mating surface 18. Holes 24, 25 extend, respectively, through the tabs 22, 23.

Figure 2:
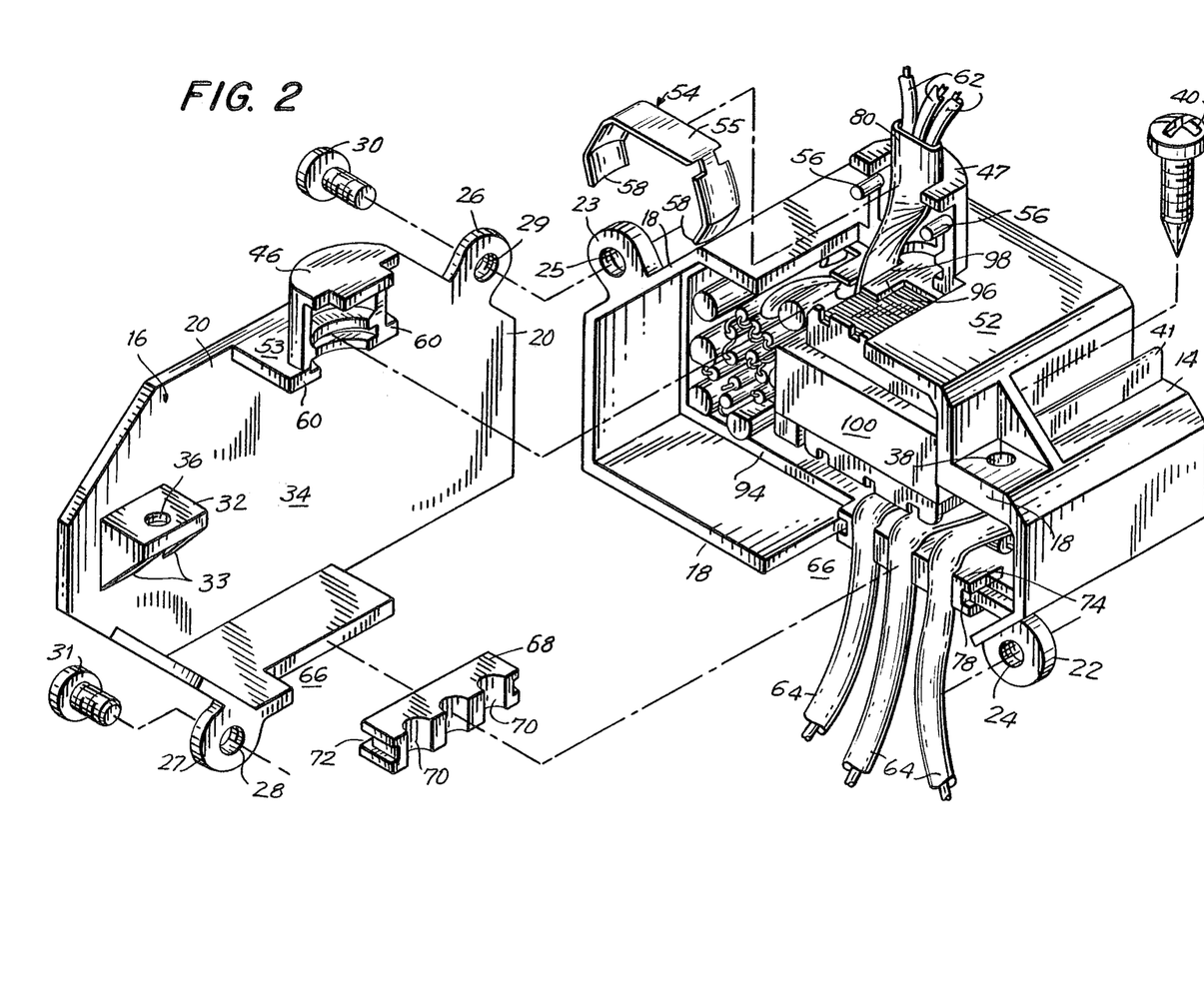
FIG. 2 is a perspective, exploded view of the device of FIG. 1.

The enclosure cover 16 includes a pair of tabs 26, 27 having clearance holes 28, 29 passing therethrough. When the cover 16 and body 14 are connected with the mating surfaces 18, 20 in abutment, tabs 22 27 with their holes 24, 28 are in abutting alignment, and tabs 23, 26 with their holes 25, 29 are in abutting alignment. The tabs are reversibly joined by self-tapping screws 30, 31 passing through the clearance holes and engaging the opposed holes.

Figure 5:
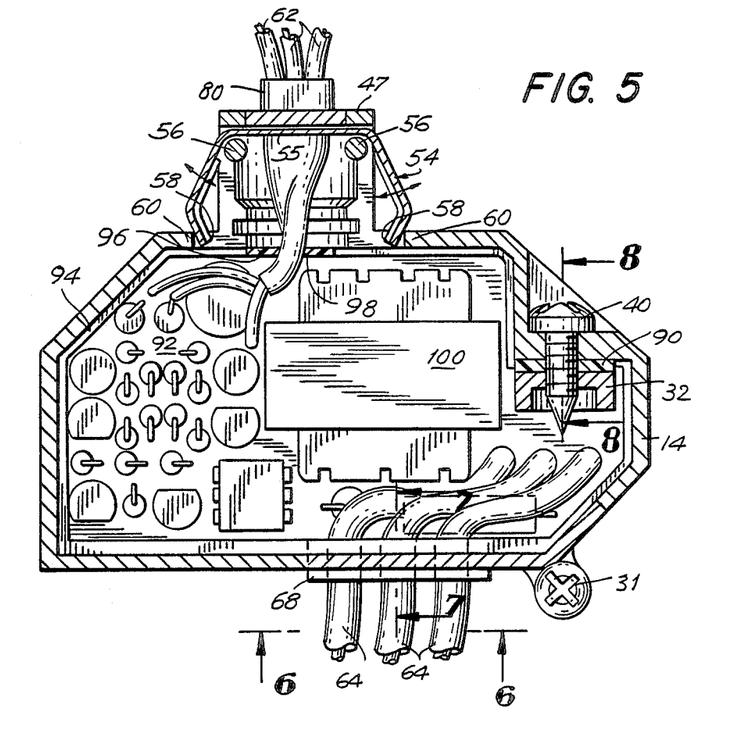
FIG. 5 is a sectional view taken along the line 5—5 of FIG. 1.

As best seen in FIG. 5, contours of the enclosure 12 are irregular so as to fit within a conventional electrical junction box used in wiring. As described more fully hereinafter circuit boards are shaped and components are arranged to fit within the enclosure.

A thermal fin 32 with triangular supports 33 extends from the main surface 34 of the cover 16 and is intregal therewith for good heat transfer characteristics. A hole 36 passes through the thermal fin 32 and when the cover 16 is assembled to the body 14, a clearance hole 38 in the body 14 aligns with the hole 36 on the cover 16 whereby a self-tapping screw 40 passed through the hole 38, engages the hole 36. The self tapping screw cuts a thread without creating metal shavings inside the enclosure 12 which could cause a short circuit in the electrical wiring. An integral extended external thermal fin 41 protrudes from the body 14 adjacent the hole 38.

Figure 1:
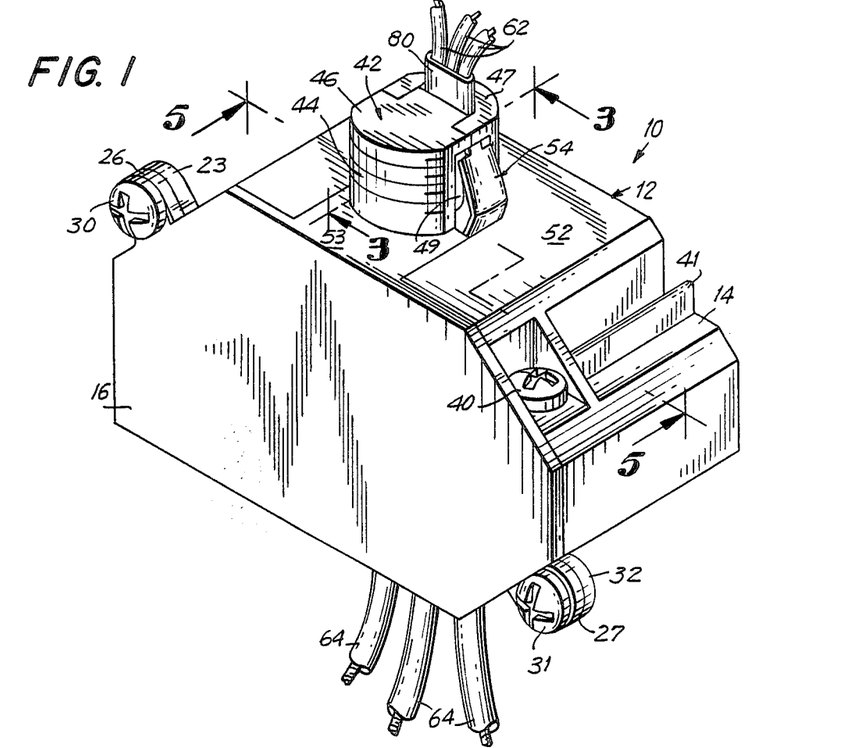
FIG. 1 is a top perspective view of a low voltage switch in accordance with the invention.

A nipple 42 having external threads 44 formed thereon extends from the upper surface (FIG. 1) of the enclosure 12. The nippel 42 is formed of two portions 46, 47, the portion 46 being formed integrally with the cover 16 so as to provide a continuous heat path between the thermal fin 32 and nipple 42. The portion 47 is formed integrally with the body 14 as best seen in FIG. 1. When the enclosure body 14 and enclosure cover 16 are joined together, the nipple portions 46, 47 form an interlocking/abutting engagement to produce a single nipple defining a circular cross-section of threads 44 (FIG. 4), which crosssection is chordally cut off to provide lateral opeings 49, 50. The outer diameter of the nipple 42 corresponds with the diameter of the knockout plugs found in conventional electrical junction boxes. Sufficient perimeter is provided on the threads (FIG. 4) to allow ready engagement with a conventional circular nut (not shown) such that when the nipple 42 is inserted through a knockout opening in a junction box and protudes through the wall of the junction box, a nut may be applied to the nipple 42 and tightened to drawn the top surfaces 52, 53 into abutting, pressurized contact with the adjacent surfaces of the junction box (not shown). Thus, a continuous heat transfer path is provide from the thermal fin 32 to the junction box by way of the enclosure walls and nipple 42.

Figure 3:
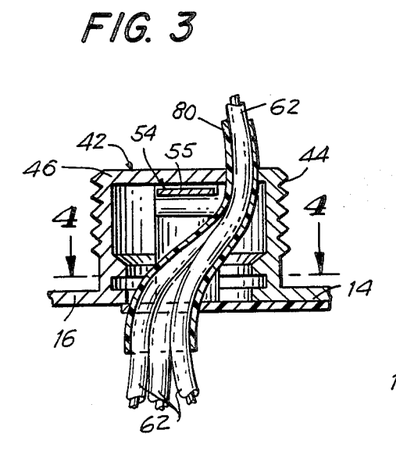
FIG. 3 is a sectional view taken along the line 3—3 of FIG. 1.
Figure 4:
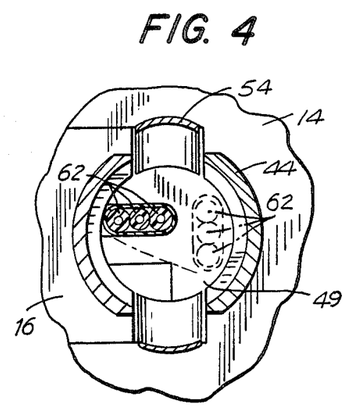
FIG. 4 is a sectional view taken along the line 4—4 of FIG. 3.

A resilient clip 54 comprises a flat strip formed into a basic C-shape having five basically straight segments (FIG. 2). As best seen in FIGS. 1 and 3, the segment 55, in an assembled low voltage switch in accordance with the invention, is constrained between the upper surfaces of the nipple portions 46, 47 and between protrusions 56 extending from the nipple portion 47. The extremities 58 of the resilient clip 54 are constrained between protrusions 60 on the nipple portion 46 and are curved to an arcuate shape as best seen in FIGS. 1, 4.

When the low voltage switch in accordance with the invention is assembled (FIG. 1), the resilient clip 54 is constrained by the nipple portions from motion along the longitudinal axis of the nipple 42. However, the extremities 58 have freedom to move radially toward the central longitudinal axis of the nipple. Thus, as the nipple 42 is inserted through a knockout opening in a junction box, or through a circular opening in a thin metal panel, the free ends of the clip are deflected resiliently inward as the nipple passes through the sheet metal and then expand resiliently outward to the original position such that it is not easily possible to remove the switch 10 from the panel or junction box without access so as to manually compress the resilient clip 54. The clip 54 draws the switch 10 into close contact with the panel or junction box such that the heat path from the thermal fin 32 into the mounting by way of the enclosure 12 is maintained albeit with not quite the same thermal effectiveness as is achieved when using a nut which engages threads 44.

Six electrical conductors extend from the low voltage switch 10 in accordance with the invention. The three wires 62 of relatively high gauge (small diameter), for low voltage application, extend through the nipple 42 and are protected by a fiberglass tubing 80. Three wires 64 of heavier gauge extend through an opening 66 in the enclosure 12 which opening remains when the body 14 and cover 16 are mated. The heavier gauge wires 64 are used to make connections to the conventional AC power source, nominally 110 or 277 volts.

Figure 6:
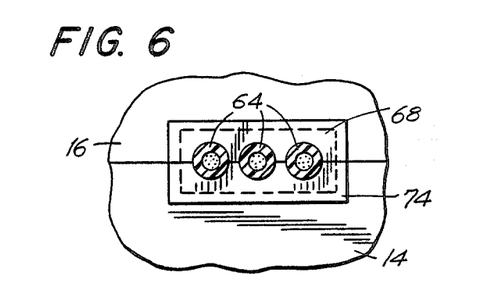
FIG. 6 is a view taken along the line 6—6 of FIG. 5.
Figure 7:
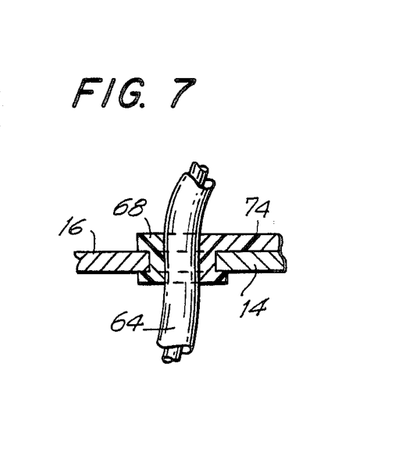
FIG. 7 is a sectional view taken along the line 7—7 of FIG. 5.
Figure 8:
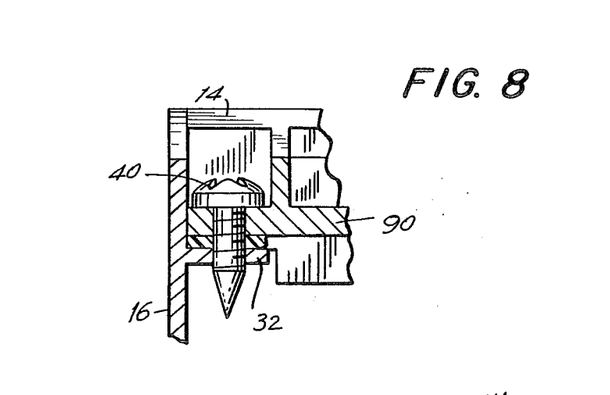
FIG. 8 is a sectional view taken along the line 8—8 of FIG. 5.

A holding bracket 68 includes three semicircular recesses 70 which are sized to receive the insulated portions of the conductors 64. The holding bracket 68 also includes a channel 72 along its outer periphery which is dimensioned for engagement with the lower surface of the cover 16 to line the bottom opening 66. The holding bracket 68 is joined to the cover 16 with the lowest surface of the cover received in the channel 72 by any suitable means, for example, an adhesive. A similar holding bracket 74 having semicircular recesses 76 and peripheral channel 78 is joined to the lower surface of the body 14 in a suitable manner, for example by adhesive, with the lower surface engaged in the channel 78. When the switch 10 is assembled with the body 14 and cover 16 in interlocking, abutting engagement, the three conductors 64 are respectively nested in circular openings formed by opposed recesses 70, 76 (FIG. 6). The conductors are constrained from movement and the grip between the holding brackets 68, 74 and the conductors 64 provides a stress relief which isolates the internal circuitry from any forces which may be applied externally to the conductors 64. Small protrusions (not shown) extended from the generally circular surfaces 70, 76 may be provided to assure a more positive grip on the wires 64.

Figure 9:
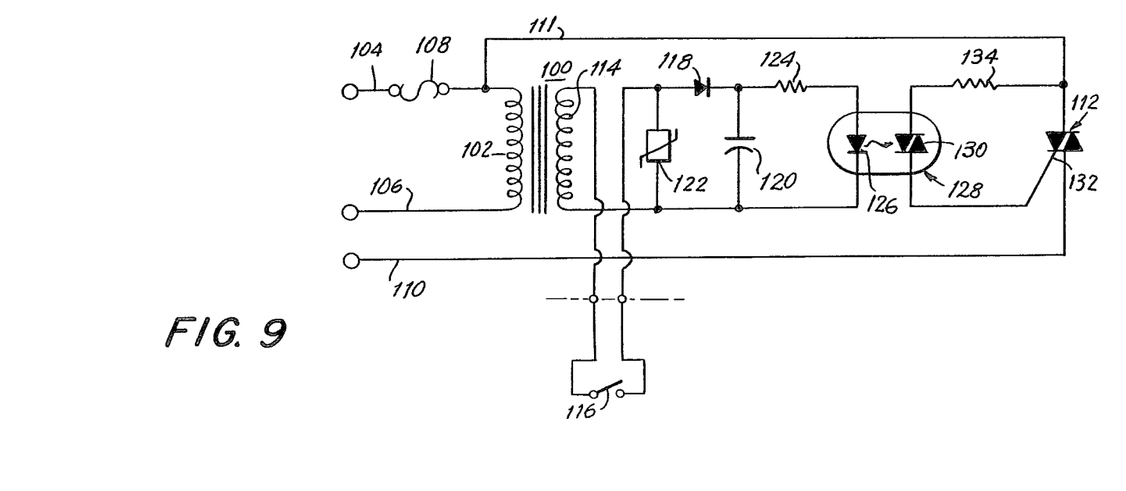
FIG. 9 is an electrical circuit suitable for use in a switch in accordance with the invention of FIG. 1.

FIG. 9 is an electrical circuit diagram for a low voltage solid state switch in accordance with the invention. A transformer 100 has its primary winding 102 connected to a power line, nominally 120 volts AC, by the leads 104, 106. A thermal fuse 108 is in the line 104 between the primary winding 102 and power source to provide protection in the event that a load connected to the switch 10 draws excessive current or there should be malfunction within the switch itself. A load (not shown) which is to be actuated by the low voltage switch 10 is connected between the lead 106 and a third lead 110. It should be noted that the lead 110 is isolated from the power lead 104 by a triac 112 which is discussed hereinafter. The triac 112 is the switch which applies power across the load when the triac 112 is conductive and isolates the load when the triac 112 is non-conducting.

The transformer 100 is a step down transformer such that the voltage on the secondary winding 114 is reduced substantially below line voltage. A single pole-single throw switch 116, which is not a portion of the invention claimed herein, is connected to one end of the transformer secondary 114 and when closed connects the secondary across a diode 118 and capacitor 120 which operate in a conventional manner to provide half wave, filtered rectification which produces a DC voltage across the capacitor 120, the voltage having a value in the order of 6.3 volts DC when the line input is 120 volt AC. A metal oxide varistor 122 is in parallel with the transformer secondary 114 when the switch 116 is closed and absorbs electrostatic charges, if any, which are introduced at the switch 116 by the switch operator. Operation of the varistor 122 prevents damage to the diode 118 and capacitor 120. A resistance 124 is in series across the capacitor 120 with the infra-red (IR) emitter diode 126 of an optoisolator 128. The output section 130 of the optoisolator is enabled for zero crossing operation when the IR emitter 126 conducts after the switch 116 is closed and a forward positive voltage is applied to the emitter 126. As indicated schematically, the output section 130 of the optoisolator 128 is a bi-directional semiconductor device (triac) which passes AC signals after it has been triggered.

The triac 112 in the line 110, 111 is a bi-directional semiconductor device which passes AC signals after it has been triggered by means of its gate 132. The gate 132 is electrically floating so long as the output section 130 of the optoisolator 128 is non-conducting. However, when the output section 130 of the optoisolator 128 is conductive, the gate of the triac 112 is driven through the output section 130 and current limiting resistor 134.

The circuit operates as follows when the power source is connected across the leads 104, 106 and a load is connected between the leads 106, 110. Upon closing the switch 116, the voltage on the secondary winding 114 drives a current through the diode 118 when the secondary voltage goes positive as indicated in FIG. 9. Thus, the capacitor 120 charges with a polarity which causes current to flow continuously through the IR emitter 126 of the optoisolator 128. The IR emission activates the output section 130 of the optoisolator 128 allowing current to flow to the gate 132 of the output triac 112 causing the triac 112 to be conductive to AC current at the time of the zero voltage crossing. Load current then passes continuously through the triac 112 by way of the leads 110, 111. In this way, a load connected to leads 106, 110 is effectively connected across the lines 104, 106 by way of the triac 112 which carries the entire load current. The metal oxide varistor 122 also protects the optoisolator 128 from electrostatic discharge when the switch 116 is closed.

Because the triac 112 carries the entire load current it will, at rated load, generate considerable heat which must be dissipated to protect the triac. For this reason, commercially available triacs are built with an integral heat dissipating fin, given the reference numeral 90 in FIGS. 5, 8, which is maintained mechanically in close connection with the enclosure 12 by "sandwiching", as described above. A triac suitable to such an application with zero-voltage switching is manufactured by Teccor Electronics, Inc. under model or part no. Q4015L5. Sandwiching of the fin 90 on both sides between the thermal fin 32 on the cover 16 and the wall of the body 14 allows the heat to be dissipated to both sides of the enclosure 12 and into a mounting panel or junction box (not shown) by way of the nipple 42 as described above.

When the switch 116 is opened, the connection between the transformer secondary 114 and the capacitor 120 is opened. The DC voltage applied to the optoisolator 128 dissipates until the output section 130 of the optoisolator becomes non-conductive thereby isolating the gate 132 of the triac 112. The triac 112 becomes an open circuit and the load is cut off by isolation from the power lead 104.

Figure 10:
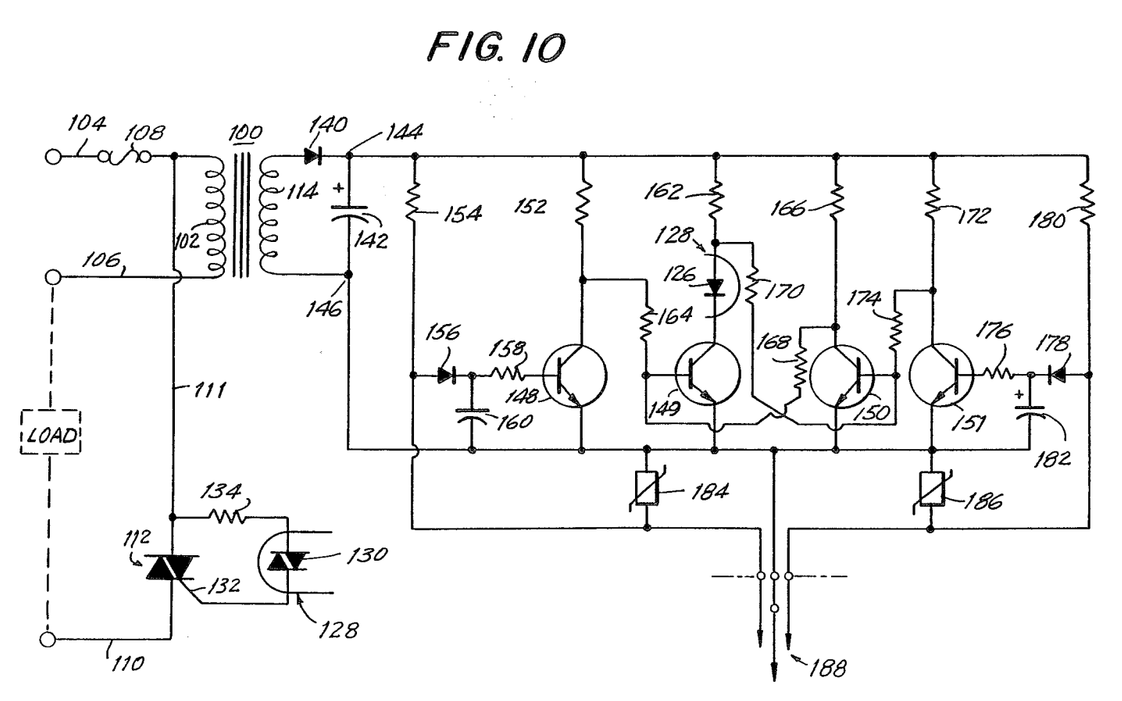
FIG. 10 is an alternative circuit for use in a switch in accordance with the invention of FIG. 1.

FIG. 10 is another circuit diagram for a low voltage switch in accordance with the invention.

In FIG. 10, the step down transformer 100 with its primary winding 102 and secondary winding 114, input leads 104, 106 and thermal fuse 108 are similar to the circuit of FIG. 9. The triac 112 is similarly positioned in the lead 110, 111 and the triac gate 132 is connected to the output section 130 of the optoisolator 128 with a current limiting resistance 134 protecting the output section 130.

The secondary winding 114 of the transformer 100 is connected across a diode 140 and capacitor 142 to provide a half wave filtered DC output as in FIG. 9. The emitters of four n-type transistors 148–151 are connected directly to the node 146 of the capacitor 142. The collector of transistor 148 is connected to node 144 of winding 114 and capacitor 142 through a resistance 152. The base of the transistor 148 is connected to the node 144 through resistor 154, diode 156 and resistor 158, and to the node 146 through a capacitor 160.

The emitter of the transistor 149 is connected directly to the node 146 and the collector of the transistor 149 is connected to the node 144 through the IR emitter diode 126 and resistance 162 in series. The base of transistor 149 is connected to the collector of transistor 148 through the resistance 164.

The emitter of transistor 150 is connected directly to the node 146 and the collector of transistor 150 is connected to the node 144 through the resistance 166. The collector of transistor 150 is connected to the base of transistor 149 through a resistance 168 and the base of transistor 150 is connected through a resistance 170 between the resistance 162 and the optoisolator IR emitter diode 126.

The transistor 151 has its emitter connected to the node 146 directly and the collector of transistor 151 is connected through a resistance 172 to the node 144. The base of transistor 150 connects to the collector of the transistor 151 by way of a resistance 174. The base of transistor 151 connects to the node 144 through a resistance 176, diode 178 and resistance 180. A capacitor 182 is connected between the resistance 176 and diode 178 at one end and to the node 146 at the other end.

Metal oxide varistors 184, 186 connect between the node 146 and the diodes 156, 178 respectively.

A single pole-double throw momentary contact switch 188 has its pole connected directly to node 146 and its two contacts connected respectively to the node 144 through resistors 154, 180. The detailed structure of the switch is not critical to the present invention.

As in the circuit of FIG. 9, the step down transformer 100 converts line voltage, for example 120 volt AC, into a half wave rectified filtered DC output across the capacitor 142 and the nodes 144, 146. Node 144 is at a positive DC voltage. The structure of the remaining control circuitry is that of a bistable latch driven by a signal recognition-conditioning stage or buffer. The bistable latch includes the transistors 149, 150 and resistances 162, 164, 166, 168, 170 and 174 as well as the IR emitter 126 of the optoisolator 128. The signal recognition conditioning stage (buffers) includes transistors 148, 151, resistances 154, 152, 158, capacitors 160, 182, diodes 156, 178 and the switch 188.

The resistances 154, 180 supply base drive to the transistors 148, 151 through the diodes 156, 178 and capacitors 160, 182. The remote control switch 188 is normally open. When the switch 188 is in this center or neutral open position, the transistors 148, 151 are in saturation. Therefore their collectors are approximately 0.4 volts above the reference of node 146 when the step down transformer 100 and rectification provide an approximate DC output voltage of 6 volts. The transistor emitters are at 0 volts, that is at the level of node 146. This condition has the effect of supplying a small negative base drive to the transistors 149, 150. This represents a "no change" state for the bistable latch. Thus, the latch remains in its previous state. In this condition, base drive is provided to one of the transistors 149, 150 by the feedback resistors 170, 168. The driven transistor conducts and the other transistor is non-conducting.

When the switch 188 is closed momentarily to either side, which to the user can be designated as either "on" or "off", that control leg falls to 0 volts because the pole of the switch 188 is connected directly to the node 146 as previously described. This connection, when the switch pole is thrown momentarily produces a change in the voltage divider comprised of resistances 154, 158 when the switch is pushed momentarily to the left (FIG. 10) and of resistances 176, 180 when the switch is pushed to the right (FIG. 10).

When the switch 188 is closed to the left, the voltage at the diode 156 is insufficient to maintain saturation in the transistor 148. When the switch is closed to the right, the voltage at the diode 178 is insufficient to maintain saturation in the transistor 151. This causes the associated transistor 148 to cut off whereby its collector is pulled near the DC supply voltage and applies base drive to the transistor 149 through resistance 164. The transistor 149 conducts and the voltage drops where resistance 170 connects to resistance 162. This lowered voltage is fed to the base of the transistor 150 which cuts off current flow in that transistor. Cut off of transistor 150 causes the voltage at the collector thereof to go to the high positive value associated with the node 144 and this voltage is applied to the base of transistor 149 through the resistance 168. Thereby, conduction of transistor 149 is latched even when the momentary switch 188 goes to its illustrated neutral, that is, open position. When switch 188 is opened the transistors 148, 151 return to saturation.

When current flows through the transistor 149, it also flows through the IR emitter 126 of the optoisolator 128. Thus, the triac 130 at the output of the optoisolator 128 is activated and current is driven through the resistance 134 to gate 132 of the load triac 112. On a zero crossing of the voltage, the triac 112 becomes conductive and a load connected between the terminals 106, 110 receives power.

This operating condition is maintained until the momentary switch 188 is again pushed manually. If the switch is again pushed ot the left, nothing changes. The transistor 149 continues to conduct and the triac 112 remains conductive. However, if the switch 188 is pushed momentarily to the right, then voltage at the base of transistor 151 falls and transistor 151 becomes non-conductive. When transistor 151 is non-conductive, the voltage at its collector increases and drives the base of the non-conducting transistor 150. Driving the base causes transistor 150 to conduct which in turn lowers its collector voltage. This lowered voltage is fed by way of resistance 168 to the base of transistor 149, causing transistor 149 to cease conduction. When transistor 149 fails to conduct, the IR emitter 126 provides no output to the triac 130 of the optoisolator 128. The gate 132 of the output triac 112 is no longer driven. Triac 112 becomes non-conductive and the load is separated from the power input lines 104, 106. This operating mode is maintained by resistance 170 which drives the base of transistor 150.

The metal oxide varistors 184, 186 protect the low voltage switching circuit inputs by absorbing electrostatic discharge surges conducted to the inputs through the control wires connected to the switch 188.

The three wire switch arrangement of FIG. 10 corresponds to the physical construction illustrated in FIGS. 1-9 wherein the leads 62 correspond to the connections to the switch 188 and the leads 64 correspond to the leads 104, 106, 110 of FIG. 10. Again, the triac 112 carries full load current and accordingly operates with elevated temperature. Heat dissipation is required in order to maintain continuous performance. The thermal fin 90 on the triac 112, connected as described above to the enclosure 12, provides a path for heat dissipation which allows continuous full load performance.

It should be noted that a plurality of switches 188 may be wired in parallel and be located at different physical locations such that the load can be turned on and off from many vantage points. Additionally, the switch it accordance with the invention can be connected with prior art electro-mechanical switches, as discussed above, if such prior art switches are also actuated remotely by manually operated low voltage momentary contact devices which are connected in parallel with the switch 188 of FIG. 10. Thus a given load can be controlled from different locations by any of several momentary switches which are either prior art, or this invention, or a combination of both type switches.

Also, it is possible to connect a plurality of switches of the invention in parallel with prior art switches where each switch provides current to its own AC load, and all switches are activated concurrently by any one of several remote manual switches, at low voltage, wired in parallel.

Use of the isolating transistors 148, 151 in the circuit of FIG. 10 avoid a problem which may arise when such prior art switches are connected in parallel with the switch 188 in accordance with the invention here. This problem arises when the electro-mechanical device applies a continuous low voltage AC onto the contact leads of the switch 188 which AC would cause erratic performance of the transistors 149, 150 if these transistors 149, 150 were not isolated by the buffer transistors, respectively, 148, 151. Capacitors 160, 182 shunt such unwanted AC signals from the bases, respectively of the transistors 148, 151 and stabilize the base voltages so that conduction of transistors 148, 151 is not interrupted except by intended operation of a remote momentary switch.

Optically isolated zero-crossing triac drivers as are suitable for component 128 of the subject invention are manufactured by General Instrument Corporation, for example, their model MCP3032.

The circuit components of FIGS. 9, 10 respectively are mounted on a printed circuit board 92, which is supported in an insulator cup 94. The cup 94 is contoured to nest within the body 14 as seen best in FIG. 5 and rests against the flat surface of the body 14, which surface is parallel to the main surface 34 of the cover 16 when the body 14 and cover 16 are joined together. An extension 96 of the cup side wall includes a slot 98 wherein the wires 62 in the fiberglass tubing 80 are passed for restraint. The holding bracket 74 may be an integral portion of the insulator cup 94.

It should be understood that the circuits of FIGS. 9, 10 may be rearranged by one skilled in the art to utilize p-type transistors in place of the illustrated transistors 148-151, with the same operational effectiveness.

It will thus be seen that the objects set forth above, among those made apparent from the preceding description, are efficiently attained and, since certain changes may be made in the above constructions without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed:

1. A low voltage switch for actuating an electrical load by completing connections of said load across AC power lines, comprising:
    a step down transformer having a primary winding, secondary winding and leads for connection of said priamry winding to said AC lines;
    rectification means for producing a DC voltage output when said rectification means is connected to said secondary transformer winding, said rectification means having terminals for connection to external switch means, electrically shorting said terminals, as by closing said switch means, connecting said rectification means to said transformer secondary and producing said DC voltage;
    an isolator having an energy emitter and energy receptor, said emitter being coupled across said DC voltage output and emitting energy when said DC voltage is produced, said receptor being located to receive at least a portion of said emitter energy, said receptor being electrically non-conductive when not receiving said energy and electrically conductive when receiving said energy, said emitter and receptor being electrically isolated one from the other;
    a triac having load terminals and a gate terminal, one of said load terminals being connected to one end of said primary transformer winding, the other of said load terminals being provided for connection to said load, said gate terminal being coupled to said receptor and being driven when said receptor is conducting, said triac being conductive when said gate is driven.

2. A low voltage switch as claimed in claim 1, wherein said isolator is an optoisolator and the number of said first terminals is sufficient for connection to an external single pole-single throw switch.

3. A low voltage switch as claimed in claim 1, wherein said rectification means provides a filtered DC output.

4. A low voltage switch for actuating an electrical load by completing connections of said load across AC power lines, comprising:
    a step down transformer having a primary winding, secondary winding and leads for connection of said primary winding to said AC lines;
    rectification means connected to said secondary transformer winding for producing a DC voltage output;
    an isolator having an energy emitter connected to said rectification means and an energy receptor, said emitter emitting energy with passage of a DC current therethrough, said receptor being located to receive at least a portion of said emitter energy, said receptor being electrically non-conductive when not receiving said energy and electrically conductive when receiving said energy, said emitter and receptor being electrically isolated one from the other;
    a triac having load terminals and a gate terminal, one of said load terminals being connected to one end of said primary winding, the other of said load terminals being provided for connection to said load, said gate terminal being connected with said receptor and being driven when said receptor is conducting, said triac being conductive when said gate is driven;
    bistable latching means connected with said energy emitter and said DC output for supplying current to said energy emitter, said latching means being operable in one of two modes, in the first of said two modes said current passes through said energy emitter causing said triac to be conductive, in the second of said two modes current flow to said emitter is cut off causing said triac to be non-conductive, said latching means having first and second input terminals, electrically driving the first input terminal placing said latching means in said first mode of operation, electrically driving the second input terminal placing said latching means in said second mode of operation, said latching means functioning to maintain an ongoing mode of operation until switched to the other mode by a driving signal input to the appropriate input terminal; and circuit means for connecting said latching means to external switch means, said latching means input terminals being subject to receiving driving signals from said circuit means for connecting to induce one or the other of said operating modes by actuation of said external switch means, said circuit means further including buffer means for isolating said latching means from said external switch means, said buffer means being connected to and receiving signals from said external switch means and inputting said signals to said latching means input terminals.

5. A low voltage switch as claimed in claim 4 wherein said isolator means is an optoisolator.

6. A low voltage switch as claimed in claim 4 wherein said latching means includes first and second transistors having their collector/emitters in parallel branch circuits across said DC output, said isolator means being in series with the collector/emitter of said first transistor, the collector voltage of each said transistor being fed back to the base of the other said transistor to form a bistable latch with one of said transistors being cut off when the other of said transistors is conductive and vice-versa, signals from said external switch means determining which of said first and second transistors is cut off and which is conducting.

7. A low voltage switch as claimed in claim 6 and further comprising a lead for connecting the low end of said DC output to a pole of said external switch means and wherein said buffer means includes a third transistor in parallel with said first transistor across said DC output, the collector of said third transistor being connected to the base of said first transistor, the base of said third transistor being connected to said DC output and being coupled to an open first terminal of said external switch means, said third transistor being normally conductive, said third transistor being cut off when said pole is thrown to contact said first external terminal, said buffer means further including a fourth transistor in parallel with said second transistor across said DC output, the collector of said fourth transistor being connected to the base of said second transistor, the base of said fourth transistor being connected to said DC output and being coupled to an open second terminal of said external switch, means, said fourth transistor being normally conductive, said fourth transistor becoming non-conductive when said pole is actuated to contact said second terminal of said external switch means.

8. A low voltage switch as claimed in claim 7 wherein capacitors and diodes connected to the bases of said third and fourth transistors provide AC rectification and filtering to maintain DC stability at said bases.

9. An enclosure for a low voltage switch, said switch including a triac having a thermally conductive fin extending therefrom, said fin being a sink for heat generated by said triac when said triac is conducting, said enclosure being of thermally conductive material, at least two faces of said triac fin being in conductive heat transfer contact with said enclosure, said enclosure further including an integral nipple of conductive material, said nipple being configured for connection to a panel or junction box surface after insertion of said nipple through an opening in said surface, a heat transfer path being provided from said triac to said panel or box surface when said enclosure and surface are in contact.

10. A low voltage switch as claimed in claim 9 wherein said enclosure is in at least two parts, said parts being reversibly connected to form said enclosure, said nipple having one of portion attached to one said enclosure parts and a second portion attached to another of said enclosure parts, said nipple portions being joined and completing said nipple when said enclosure parts are connected.

11. A low voltage switch as claimed in claim 9 wherein said nipple has a cross section which is at least in part circular and externally threaded.

12. A low voltage switch as claimed in claim 11 and further comprising resilient means radially protruding from said nipple, said resilient means being radially and reversibly moveable and subject to radial compression when said nipple passes through an opening of diameter corresponding to the diameter of said circular part of said nipple, said resilient means expanding radially after passing through said opening, said expanded resilient means impeding withdrawal of said nipple from said opening.

13. A low voltage switch for actuating an electrical load by completing connections of said load across AC power lines, comprising:

a step down transformer having a primary winding, secondary winding and leads for connection of said primary winding to said AC lines;

rectification means for producing a DC voltage output when said rectification means is connected to said secondary transformer winding, said rectification means having terminals for connection to external switch means, electrically shorting said terminals, as by closing said switch means, connecting said rectification means to said transformer secondary and producing said DC voltage;

an isolator having an energy emitter and energy receptor, said emitter being coupled across said DC voltage output and emitting energy when said DC voltage is produced, said receptor being located to receive at least a portion of said emitter energy, said receptor being electrically non-conductive when not receiving said energy and electrically conductive when receiving said energy, said emitter and receptor being electrically isolated one from the other;

a triac having load terminals and a gate terminal, one of said load terminals being connected to one end of said primary transformer winding, the other of said load terminals being provided for connection to said load, said gate terminal being coupled to said receptor and being driven when said receptor is conducting, said triac being conductive when said gate is driven, said triac further including a thermally conductive fin extending therefrom, said fin being a sink for heat generated by said triac when said triac is conducting; and an enclosure for containing at least said triac, said enclosure being of thermally conductive material, at least two faces of said triac fin being in conductive heat transfer contact with said enclosure, said enclosure further including an integral nipple of conductive material, said nipple being configured for connection to a panel or junction box surface after insertion of said nipple through an opening in said surface, a heat transfer path being provided from said triac to said panel or box surface when said enclosure and surface are in contact.

14. A switch as claimed in claim 13 and further comprising means for retaining said nipple inserted through said opening in said panel or box surface with said enclosure in heat transfer contact with said panel or box surface.

15. A low voltage switch as claimed in claim 13 wherein said enclosure is externally contoured to fit within a conventional electrical junction box with said nipple passing through an opening in said box.

16. A low voltage switch as claimed in claim 13 wherein said enclosure is in at least two parts, said parts being reversibly connected to form said enclosure, said nipple having one portion attached to one or said enclosure parts and a second portion attached to another of said enclosure parts, said nipple portions being joined and completing said nipple when said enclosure parts are connected.

17. A low voltage switch as claimed in claim 13 wherein said nipple has a cross section which is at least in part circular and externally threaded.

18. A low voltage switch as claimed in claim 17 and further comprising resilient means radially protruding from said nipple, said resilient means being radially and reversibly moveable and subject to radial compression when said nipple passes through an opening of diameter corresponding to the diameter of said circular part of said nipple, said resilient means expanding radially after passing through said opening, said expanded resilient means impeding withdrawal of said nipple from said opening.

19. A low voltage switch for actuating an electrical load by completing connections of said load across AC power lines, comprising:
- a step down transformer having a primary winding, secondary winding and leads for connection of said primary winding to said AC lines;
- rectification means connected to said secondary transformer winding for producing a DC voltage output;
- an isolator having an energy emitter connected to said rectification means and an energy receptor, said emitter emitting energy with passage of a DC current therethrough, said receptor being located to receive at least a portion of said emitter energy, said receptor being electrically non-conductive when not receiving said energy and electrically conductive when receiving said energy, said emitter and receptor being electrically isolated one from the other;
- a triac having load terminals and a gate terminal, one of said load terminals being connected to one end of said primary winding, the other of said load terminals being provided for connection to said load, said gate terminal being connected with said receptor and being driven when said receptor is conducting, said triac being conductive when said gate is driven, said triac further including a thermally conductive fin extending therefrom, said fin being a sink for heat generated by said triac when said triac is conducting;
- bistable latching means connected with said energy emitter and said DC output for supplying current ot said energy emitter, said latching means being operable in one of two modes, in the first of said two modes said current passes through said energy emitter causing said triac to be conductive, in the second of said two modes current flow to said emitter is cut off causing said triac to be non-conductive, said latching means having first and second input terminals, electrically driving the first input terminal placing said latching means in said first mode of operation, electrically driving the second input terminal placing said latching means in said second mode of operation, said latching means functioning to maintain an ongoing mode of operation until switched to the other mode by a driving signal input to the appropriate input terminal;
- circuit means for connecting said latching means to external switch means, said latching means input terminals being subject to receiving driving signals from said circuit means for connecting to induce one or the other of said operating modes by actuation of said external switch means; and
- an enclosure for containing at least said triac, said enclosure being of thermally conductive material, at least two faces of said triac fin being in conductive heat transfer contact with said enclosure, said enclosure further including an integral nipple of conductive material, said nipple being configured for connection to a panel or junction box surface after insertion of said nipple through an opening in said surface, a heat transfer path being provided from said triac to said panel or box surface when said enclosure and surface are in contact.

20. A low voltage switch as claimed in claim 19 and further comprising means for retaining said nipple inserted through said opening in said panel or box surface with said enclosure in heat transfer contact with said panel or box surface.

21. A low voltage switch as claimed in claim 19 wherein said enclosure is externally contoured to fit within a conventional electrical junction box with said nipple passing through an opening in said box.

22. A low voltage switch as claimed in claim 19 wherein said enclosure is in at least two parts, said parts being reversibly connected to form said enclosure, said nipple having one portion attached to one of said enclosure parts and a second portion attached to another of said enclosure parts, said nipple portions being joined and completing said nipple when said enclosure parts are connected.

23. A low voltage switch as claimed in claim 19 wherein said nipple has a cross section which is at least in part circular and externally threaded.

24. A low voltage switch as claimed in claim 23 and further comprising resilient means radially protruding from said nipple, said resilient means being radially and reversibly moveable and subject to radial compression when said nipple passes through an opening of diameter corresponding to the diameter of said circular part of said nipple, said resilient means expanding radially after passing though said opening, said expanded resilient means impeding withdrawal of said nipple from said opening.

* * * * *